United States Patent
Ouici

(10) Patent No.: US 7,321,270 B2
(45) Date of Patent: Jan. 22, 2008

(54) CURRENT-CONTROLLED CMOS RING OSCILLATOR CIRCUIT

(75) Inventor: Khalid Ouici, Kelowna (CA)

(73) Assignee: ESS Technology, Inc., Fremont, CA (US)

( * ) Notice: Subject to any disclaimer, the term of this patent is extended or adjusted under 35 U.S.C. 154(b) by 77 days.

(21) Appl. No.: 11/404,443

(22) Filed: Apr. 13, 2006

(65) Prior Publication Data

US 2006/0232345 A1    Oct. 19, 2006

Related U.S. Application Data

(60) Provisional application No. 60/671,423, filed on Apr. 14, 2005.

(51) Int. Cl.
*H03B 5/24* (2006.01)

(52) U.S. Cl. ................................. 331/57; 331/175

(58) Field of Classification Search .................. 331/57, 331/175; 327/256, 284, 288
See application file for complete search history.

(56) References Cited

U.S. PATENT DOCUMENTS 5,180,995 A * 1/1993 Hayashi et al. ............... 331/57

* cited by examiner

*Primary Examiner*—David Mis
(74) *Attorney, Agent, or Firm*—Kenta Suzue; Haynes Beffel & Wolfeld LLP

(57) ABSTRACT

A ring oscillator having an odd number of active elements connected in series, where the signal output of one active element is connected to the signal input of the next active element to form a closed ring of active elements. Each active element has a power supply input and a ground connection, a signal input and a signal output, an inverter sub-element having a pair of current mirrors, and a capacitor controlled bias sub-element.

5 Claims, 4 Drawing Sheets

Simulation with 1nA to get 5KHz

CURRENT-CONTROLLED CMOS RING OSCILLATOR CIRCUIT

BACKGROUND

The invention described herein relates to oscillators for generating electrical oscillation waves or clock pulses, and more particularly to ring oscillators. Ring oscillators are characterized by having an odd number of active elements, such as amplifiers or inverters connected in series or cascade in a ring configuration. In a ring oscillator the output of one active element is connected to the input of another active element to form a closed chain or loop. The active elements of a ring oscillator are connected and biased such that they generate self-sustained oscillations. The states may be conducting and non-conducting states thereby generating self-sustained oscillations.

Oscillators are vital components in a variety of electronic and microelectronic circuits, including analog circuits, digital circuits, mixed analog-digital circuits and radio frequency circuits in sensors, radio receivers, radio transmitters, navigation equipment, etc. Within these devices oscillators are used or in conjunction with as Phase Locked Loops (PLL), clock generators, frequency generators, frequency multipliers, frequency dividers, and mixers among other circuit components.

One type of oscillator is a ring oscillator. Connecting an odd number of inverting gain stages in a ring, as shown generally in FIG. 1 can make a ring oscillator. FIG. 1 illustrates three inverting amplifiers in series in a closed ring configuration. Each individual inverting amplifier may be implemented as a CMOS inverter, as shown in FIG. 2.

In actual circuit implementation, ring oscillators are subject to jitter and noise. One source of noise is oscillator phase noise, while a frequent source of jitter is random phase delays that are converted to random time delays along the inverter ring. The noise and jitter is undesirable, especially in an oscillator incorporated in a low voltage integrated circuit having a relatively low input and/or output voltage. Therefore, there exists a need for improved oscillators that are less subject to jitter and noise, have a wide tuning range, and a fast switching time. As will be seen, the invention provides such an improved oscillator in an elegant manner.

SUMMARY OF THE INVENTION

The invention is an improved ring oscillator that provides lower jitter and noise, wider tuning range, and faster switching times relative to conventional devices. A system configured according to the invention provides a simple, fully symmetrical, current-controlled CMOS ring oscillator.

The ring oscillator has an odd number of active elements, such as amplifiers or inverters. The active elements are connected in a series or cascade in a ring configuration. In particular, the output of one active element is connected to the input of the next active element in the closed ring of active elements. The active elements of the ring oscillator are connected in series and biased to generate self sustained oscillations by switching the elements from a first conducting state to a second conducting state in succession. In one embodiment, the internal circuitry of the active element includes an inverter element, a current mirror element in parallel with the inverter element, and a current bias element in parallel with the inverter element and the current mirror element and containing a capacitor.

FIGURES

DETAILED DESCRIPTION

The invention is an improved ring oscillator that provides lower jitter and noise, a wider tuning range, and faster switching times relative to conventional devices. A system configured according to the invention provides a simple, fully symmetrical, current-controlled CMOS ring oscillator.

According to the invention, a ring oscillator is described herein that has an odd number of active elements, such as amplifiers or inverters. The active elements are connected in a series or cascade in a ring configuration. In particular, the output of one active element is connected to the input of the next active element in the closed ring of active elements. The active elements of the ring oscillator are connected in series and biased to switch from a first conducting state to a second conducting state in succession. The active element internal circuitry includes a current mirror inverter element, and a current bias element in parallel with the current mirror inverter element and containing a capacitor. The current mirror inverter contains two current mirrors in series between the power supply and ground.

In one embodiment the oscillator uses grounded capacitors. This architecture permits a rail-to-rail output, thus further minimizing jitter and phase noise and allowing low voltage operation. The design also operates with power supply voltages as low as the threshold of a CMOS device typically 0.4 volts or less in current technologies. Because there are no special capacitor requirements, the ring oscillator apparatus described herein is compatible with standard scaled digital CMOS processes, and is scalable over a very wide range of frequencies.

The ring oscillator has an odd number of inverter stages connected in series, where the output of one inverter stage is connected to the input of the next inverter stage to form a closed ring of inverter stages. Each inverter stage has a power supply and a ground connection, and a signal input and a signal output, and with a current mirror inverter pair in series between the signal input and signal output, and the current mirrors being in head to tail (drain of one current mirror in series of the source of the next current mirror) aeries with a capacitor controlled bias sub-element in parallel with legs of one current mirror between the signal input and the signal output, and in series between the power supply and the ground. This controls jitter.

The current mirror inverter pair comprises a PMOS current mirror in series with an NMOS current mirror between a power supply and a ground (with a control element 341 in series between the current mirrors), where DVCC represents the power supply, and DGND represents the ground. This architecture allows a "full rail-to-rail output swing."

Figure 1:
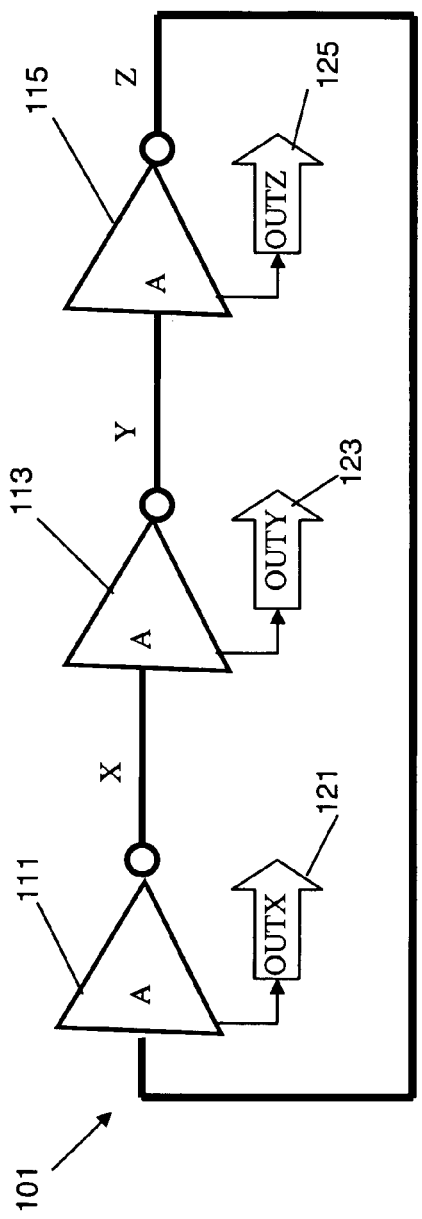
FIG. 1 illustrates, generally, a three-inverter ring oscillator with individual outputs off of each inverter stage, and outputs from each individual inverter stage to the next inverter in series.

A three-stage ring oscillator is illustrated in FIG. 1. The ring oscillator 101 has an odd number of stages, 111, 113, and 115. Each stage 111, 113, 115, is an inverting amplifier, comprising an inverter illustrated symbolically as an amplifier and an inverter. Each inverter stage, 111, 113, 115, has a direct output, OUTX 121 from stage 111, OUTY 123 from stage 113, and OUTZ 125 from stage 113, and a series output as input to the next stage, output X 131 from a first stage 111 to a second stage 113, output Y 133 from second stage 113 to third stage 115 and output Z 135 from the third stage 115 to a next stage or as feedback to the first stage 111. It is to be noted that the direct outputs, OUTX 121 from stage 111, OUTY 123 from stage 113, and OUTZ 125 from stage 113, are not believed to be present in ring oscillators of the prior art.

Figure 2:
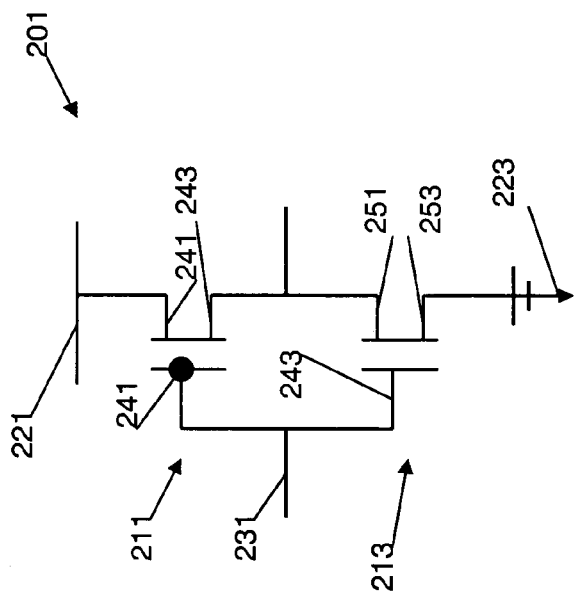
FIG. 2 illustrates a single inverter element within an inverter with an input to the individual gate electrodes of two CMOS transistors connected in series from a voltage source to ground and in parallel between the signal input and signal output.

An inverter, 201, is shown generally in FIG. 2. The inverter 201 is an element of each stage 111, 113, 115 of the ring oscillator 101 described herein. The inverter comprises two MOSFET transistors 211, 213 electrically in series between the power supply 221 and ground 223, and electrically in parallel between the signal input 231 and the inverted signal output 233 thereof. The source 241 of the first MOSFET transistor 211 is connected to the power supply 221, and the drain 243 of the first MOSFET transistor 211 is connected to the drain 251 of the second MOSFET transistor 213. The source 253 of the second MOSFET transistor 213 is grounded 223.

The signal input 231 is connected to the gate electrodes 225 and 227 of the MOSFET transistors 211 and 213. The gate electrodes, that is, an inverted gate electrode 225 of the first MOSFET p-type transistor 211 and the gate electrode 227 of the second MOSFET n-type transistor 213, gate the respective CMOS transistors, 211 and 213. The inverter 201 produces an inverted signal output 233.

Figure 3:
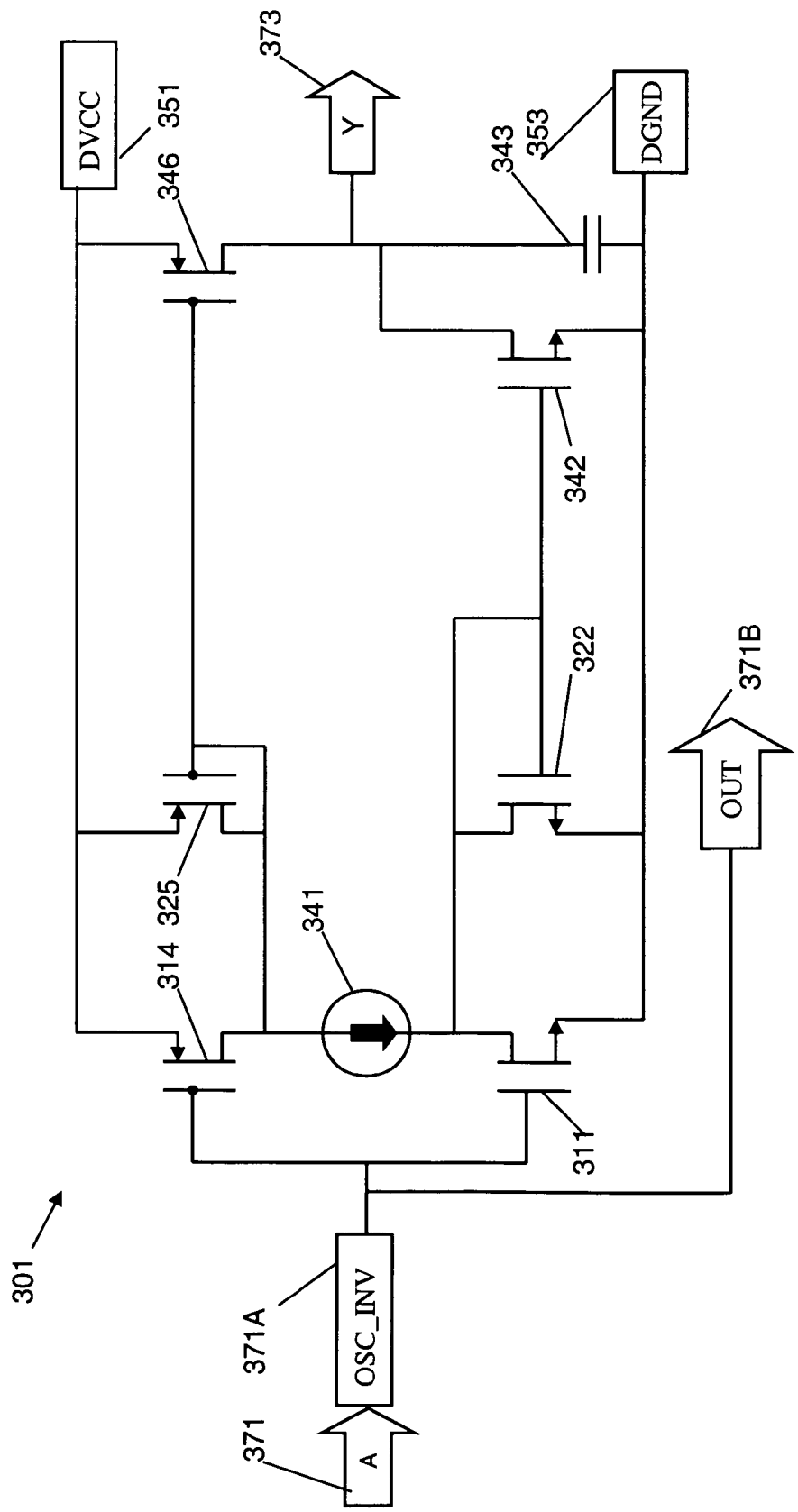
FIG. 3 illustrates a single inverter stage, including an inverter element such as FIG. 2, a PMOS and NMOS current mirrors, a biasing element and capacitor.

FIG. 3 is a representation of an individual inverter stage, as stage 111, stage 113, or stage 115, of the ring oscillator 101 described herein. To be noted is the current mirror, including elements NMOS transistor 322 (in parallel with NMOS transistor 311) and PMOS transistor 325 (in parallel with PMOS transistor 314) which, when enabled via NMOS transistor 311 and PMOS transistor 314, with a capacitor 343 drive PMOS transistor 346 at a predictable and adjustable current. Transistors 311 and 314 shunt voltage across transistors 322 and 325. Transistors 325 and 346 constitute one current mirror (where transistor 325 is connected as a diode), and transistors 322 and 342 constitute the other current mirror (where transistor 322 is connected as a diode). The current mirrors (325, 346 and 322, 342) are in signal input to signal output series between the signal input 371 and the signal output 373, and in head to tail series between the power supply 351 and the ground 353. Transistor 314 enables transistor 325, which is mirrored to transistor 346, and transistor 311 enables transistor 322, which is mirrored to transistor 342 (which is, in turn, in parallel with capacitor 343). The current in transistors 314 and 311 is determined by a current source ISRC 341. The current source ISRC 341, where the control element is not shown, and associated current mirror element, that is, transistors 322 and 325 provide the operating characteristics of each stage of the ring oscillator, with transistors 342 and 346 driving the output 373, and of the overall ring oscillator circuit. It is to be noted that the control input to the current source 341, while not shown, is present. Elements 373 and 343 can hold a load.

The resulting stage is a low power stage; that is, it has a lot of "head room", or, in other words, extends the voltage range within which the power supply can vary between the power supply 351 input voltage and the ground 353 could be as low as a threshold of a CMOS device. The consequence of this is that the circuit can operate as the threshold voltages of the NMOS and PMOS devices without any problem, and with inversion of the input signal, 371, 371A, 371B into an inverted output 373.

To be noted is that in the prior art, circuits performing the same function are used either with fixed frequency of operation, or by changing the sizes of NMOS transistor 342 and PMOS transistor 346 to drive the capacitor 343 (the capacitor 343 being in parallel with NMOS transistor 342).

In operation, the circuit may be energized, that is, released, with an initial voltage at each node equal to the trip point of the individual inverters. With identical stages and no noise in the devices the circuit 301 would remain in this stage indefinitely, but noise components disturb each node voltage, yielding a growing waveform. The signal eventually exhibits rail-to-rail swings.

For example, assume that the circuit 101 above begins with $V_x$=VDD. Under this condition, $V_y$=0 and $V_z$=VDD. When a circuit of the prior art is released, $V_x$ begins to fall to zero (because the first inverter senses a high input), forcing $V_y$ to rise to VDD after one inverter delay, $T_D$, and $V_z$ to fall to zero after another inverter delay. The circuit therefore oscillates with a delay of $T_D$ between consecutive node voltages, yielding a period of $6T_D$. $\omega_0$ is functionally determined by the small signal output resistance and the capacitance of each inverter near the trip point.

According to the invention, a circuit so configured may adjust the current over a very wide range from as little as 1 nA to more than 100 uA (corresponding to $f_{min}$=5 KHz and $f_{max}$=133 MHz a range of frequencies more than 26000:1). This is beyond conventional circuits.

When the input (A) 371 is low, when this circuit is released, the output of the osc_inv (OUT) begins to rise to VDD, under this condition, NMOS transistor 311 is turned ON (Pulls down the node NN to ground) and PMOS transistor 314 is turned OFF. This will turn ON PMOS transistor 325 and source the current. This will be copied to PMOS transistor 346. This will charge the capacitor. However, if the input (A) is high, when this circuit is released, the output of the osc_inv (OUT) begins to fall to zero, under this condition, NMOS transistor 311 is turned OFF and PMOS transistor 314 is turned ON. This will let NMOS transistor 322 sink the current coming from the current source 341 ISRC and it will be copied to NMOS transistor 342. Sinking transistor 342 discharges the capacitor 343.

According to the invention, he use of explicit current mirror devices PMOS 325 and NMOS 322 such as when enabled via PMOS 314 and NMOS 311 the capacitor driving device run at a predictable and adjustable current determined by the current source ISRC.

Figure 4:
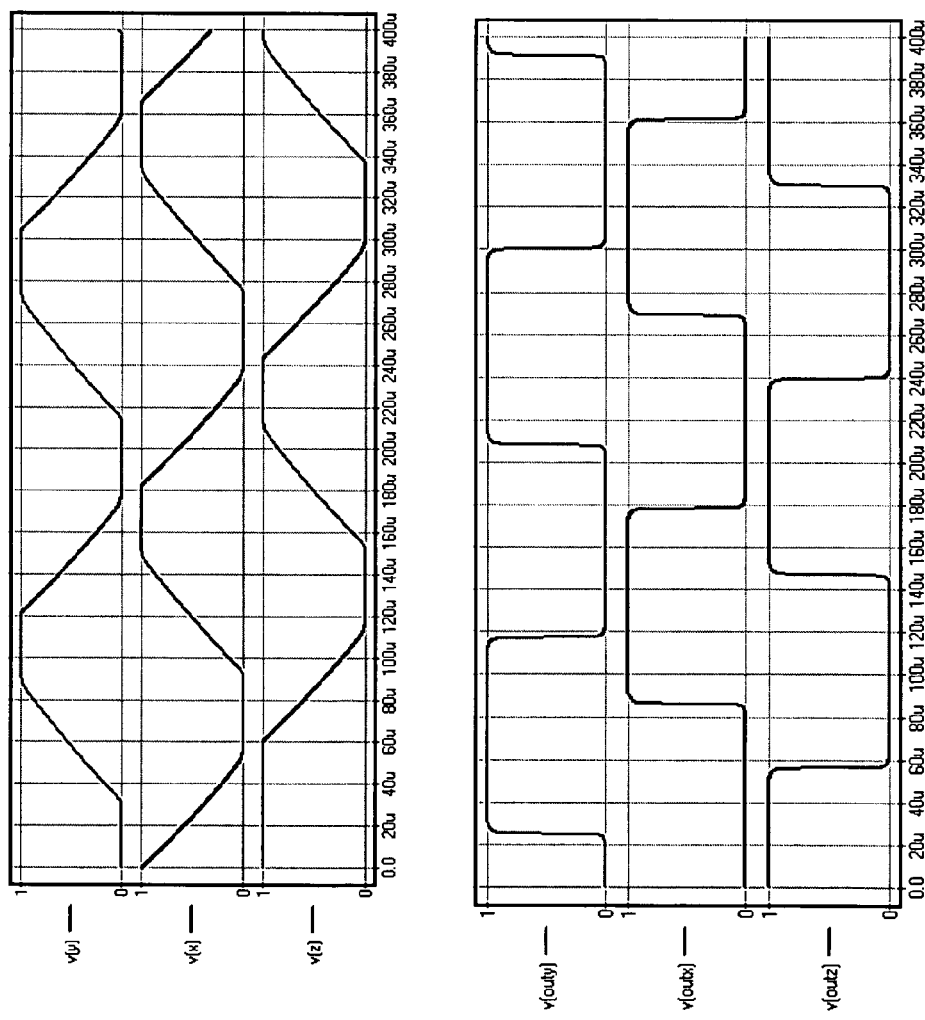
FIG. 4 illustrates a simulation of a three-inverter stage ring oscillator of the invention with a 1 nano-amp. bias current to get a 5 kilohertz output signal.

FIG. 4 is an illustration of a PSPICE simulation of the circuit shown in FIG. 1 with the waveforms VDD=1V and $T_D$=33.33 uS, where the current is 1 nA and the power supply is 1V, the average power consumption is 180 nA to get 5 KHz with a RMS jitter of 2 pS. This is a considerably low jitter, an elegant feature offered by the invention. The large signal oscillation frequency is $1/(6T_D)$. The output amplitude is as large as the power supply (VDD−GROUND). This makes the waveform less sensitive to noise. Thus, a circuit configured according to the invention is less susceptible to such noise, and the output of such an oscillator would thus be more refined.

Figure 5:
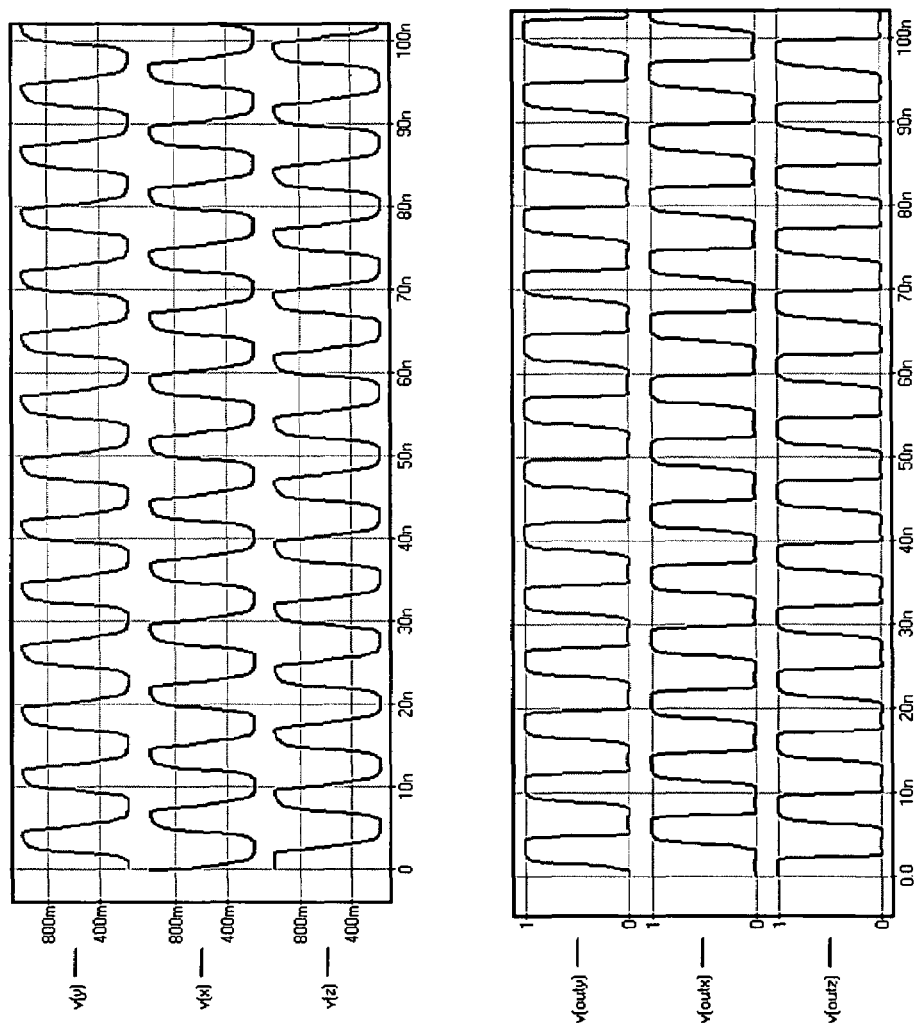
FIG. 5 illustrates a simulation of a three-inverter stage ring oscillator of the invention with a 100 micro-amp. bias current to get a 133 megahertz output signal.

The oscillator circuit shown in FIG. 1 is operable over a very wide range of current. FIG. 5 illustrates a PSPICE™ simulation with the waveforms VDD=1V and $T_D$=1.25 nS. In this simulation, the current is 100 uA and the power supply is 1V, the average power consumption is 1.69 mA to get 133 MHz with a RMS jitter of 89 fS. Note that the current ratio in both simulations is a factor of 100000 times. Thus, the tuning range is very wide and could be programmable; we need to tune only the current to get the desired frequency. Also, even with a constant current, the output waveform is not perfectly periodic. However, it is very close to 50% duty cycle.

According to the invention, a current controlled ring oscillator with mirrored CMOS transistors provides an oscillator circuit that is easily adjustable over a very wide frequency range relative to conventional circuits. As will be evident to those skilled in the art, this wide current range offers a wide range of frequencies limited only by the capacitance (either parasitic or deliberately added) on the output node (Y) in FIG. 3. Typically, with common CMOS, the range can be from about 5 KHz to about 133 MHz. Thus, the ring oscillator described herein can be used for high-speed designs as well as low-speed designs. Also, the design of the ring oscillator described herein can be used for low-power low-voltage designs.

While the invention has been described with respect to certain preferred embodiments and exemplifications, the invention is not limited thereby, but solely by the claims appended hereto and their equivalents.

I claim:

1. A ring oscillator having an odd number of inverters connected in series, the output of one inverter being connected to the input of the next inverter to form a closed ring of inverters, each inverter having a power supply input and a ground connection, a signal input and a signal output, and with a current mirror inverter pair in signal input to signal output series between the signal input and signal output, and in head to tail series between the power supply input and the ground.

2. The ring oscillator of claim 1 having a capacitor controlled bias sub-element in parallel with legs of one current mirror between the signal input and the signal output, and in series between the power supply and the ground.

3. The ring oscillator of claim 1 comprising:
    a. a first PMOSFET having a source in series with a power supply DVCC, a current source in series with a drain of the PMOSFET, and a first NMOSFET in series with the current source, the gates of the PMOSFET and NMOSFET each connected to a signal input of a preceding element;
    b. a second PMOSFET in parallel with the first PMOSFET, the drain of the second PMOSFET connected to the gate of the second PMOSFET and to the current source;
    c. a second NMOSFET in parallel with the first NMOSFET the source of the second NMOSFET in series with the current source and connected to the gate of the second NMOSFET, the drain of the second NMOSFET connected to a ground;
    d. a bias circuit comprising:
        i. a third PMOSFET having its source connected to the DVCC power supply, having its gate connected to the gate of the second PMOSFET, and having its drain connected to the signal output, and
        ii. a parallel fourth NMOSFET and capacitor, the output of the capacitor and the drain of the fourth NMOSFET connected to ground, the gate of the fourth NMOSFET connected to the signal output and in series with fourth PMOSFET, and the gate of the fourth PMOSFET connected to the gate of the third PMOSFET.

4. The ring oscillator of claim 1 wherein the current source is a constant current source.

5. The ring oscillator of claim 1 wherein the current source is a variable current source.

* * * * *